United States Patent

[11] 3,625,783

[72] Inventor Alexander Coucoulas
Bridgewater Township, Somerset County, N.J.
[21] Appl. No. 822,428
[22] Filed May 7, 1969
[45] Patented Dec. 7, 1971
[73] Assignee Western Electric Company, Incorporated
New York, N.Y.

[54] SIMULTANEOUS BONDING OF MULTIPLE WORKPIECES
16 Claims, 9 Drawing Figs.

[52] U.S. Cl. .......... 156/73, 156/446, 29/471.1
[51] Int. Cl. .......... B29c 27/08, B65c 9/04, B23k 31/02
[50] Field of Search .......... 156/73, 444, 446; 29/470.1, 471.1

[56] References Cited

UNITED STATES PATENTS

| | | | |
|---|---|---|---|
| 3,300,851 | 1/1967 | Lodder | 156/73 X |
| 3,374,537 | 3/1968 | Doeld, Jr. | 29/471.1 X |
| 3,391,041 | 7/1968 | Moore | 156/446 X |

*Primary Examiner*—Benjamin A. Borchelt
*Assistant Examiner*—J. J. Devitt
*Attorneys*—H. J. Winegar, R. P. Miller and W. M. Kain

ABSTRACT: Methods and apparatus for simultaneously bonding a plurality of first workpieces to spaced-apart locations on at least one second workpiece. The invention is particularly suited for simultaneously bonding a plurality of lead wires to the terminal land areas of an integrated circuit or other electronic device. A deformable, compliant support member is spirally wound with a continuous metallic filament. After the spiral has been formed it is secured to the support member by any suitable adhesive means. The edges of the support member are sheared to cut the spiral windings and thus form a plurality of lead wires. The indentations which are formed on the reverse side of the support member when the spiral is cut may be used for alignment purposes. Thermal and/or mechanical bonding energy applied through the support member bonds the plurality of lead wires to the integrated circuit.

INVENTOR
A. COUCOULAS
BY Bryan W. Sheffield
ATTORNEY

SIMULTANEOUS BONDING OF MULTIPLE WORKPIECES

BACKGROUND OF THE INVENTION

1. Field of the Invention

This invention relates to bonding and, more particularly, to methods and apparatus for bonding a plurality of first workpieces to spaced-apart locations on at least one second workpiece. The invention is particularly useful for bonding lead wires to electronic components such as thin-film devices, integrated circuits, and printed circuit boards, but is not so limited.

2. Description of the Prior Art

In the manufacture of workpieces, for example integrated circuits and the like, it is frequently necessary to bond a plurality of electrical lead wires to the workpiece. These lead wires are required to complete the electrical interconnections between the workpiece and any external components with which it is to work.

Any of several known bonding techniques may be used to provide these bonds. For example, copending application Ser. No. 651,411, dated July 6, 1967, now U.S. Pat No. 3,533,155, issued Oct. 13, 1970, discloses several methods which, by the use of a compliant bonding medium, produce high quality bonds eminently suitable for bonding applications such as above described. The bonds to the integrated circuit, or other workpiece, may be produced one at a time, but it is preferable if a large number of bonds are produced simultaneously. The above-identified copending application discloses a method for simultaneously bonding the plurality of beam leads which extend from a beam leaded semiconductor device, and the compliant bonding techniques disclosed therein may also be used to simultaneously bond a plurality of leads to a conventional integrated circuit. In that event, a lead frame would be used, the lead frame being positioned intermediate the compliant bonding medium and the integrated circuit to be bonded. A lead frame is, of course, a device which is manufactured by stamping out a pattern of leads and lead supports from a sheet of relatively soft material, such as copper. The stamping die is designed so that the free ends of the lead wires which extend outward from the lead supports align with the terminal land areas of the integrated circuit when the lead frame is superimposed over, and registered with respect to, the integrated circuit.

After the lead frame is registered with respect to the workpiece, a suitably patterned compliant member, for example a sheet of 2024 aluminum alloy having a central aperture therein corresponding to the shape of the integrated circuit, is placed over the lead frame and vibratory and/or mechanical bonding energy applied through the compliant member to bond the free end of each lead to the corresponding terminal land area of the workpiece.

The results which have been obtained by applying the compliant bonding techniques disclosed in the above-referenced copending application to lead frame applications are uniformly excellent. However, at least two steps are involved in making simultaneous bonds. These steps are: (1) the lead frame must be registered with respect to the workpiece, and (2) the compliant member must be positioned over both the lead frame and the workpiece prior to bonding. In addition, by virtue of the manner in which lead frames are manufactured, the leads themselves have a generally flat cross section. This is also true, it should be noted, of the plated beam leads on a beam lead device. As is well known, however, in some applications, for example where the integrated circuit draws a considerable amount of current, it is advantageous for the leads which interconnect the workpiece and the associated external circuitry to have a circular cross section and hence a lower resistance to the passage of current. Unfortunately, leads of such a circular cross section cannot be easily obtained with conventional lead frame devices or with beam lead devices.

SUMMARY OF THE INVENTION

The instant invention, which is an improvement over the invention disclosed in the above-referenced copending application, solves both of the above-mentioned problems and comprises a method of manufacturing an assembly for bonding a plurality of first workpieces to spaced-apart locations on at least one second workpiece. The method comprises the steps of (1) winding a filament about a compliant support member and (2) securing the filament to at least one surface of the support member. One specific illustrative embodiment of the invention comprises an aluminum support member which is wound with a continuous gold filament. The filament is secured to one surface of the support member by a strip of adhesive tape. The second workpiece typically comprises an integrated circuit having a plurality of gold-plated terminal land area along the edges thereof.

OBJECT OF THE INVENTION

It is an object of this invention to provide improved methods and apparatus for simultaneously bonding a plurality of first workpieces to spaced-apart locations on at least one second workpiece.

It is a further object of this invention of provide an improved method of simultaneously bonding a plurality of leads to an electronic component, such as a thin-film integrated circuit.

DETAILED DESCRIPTION

Figure 1:
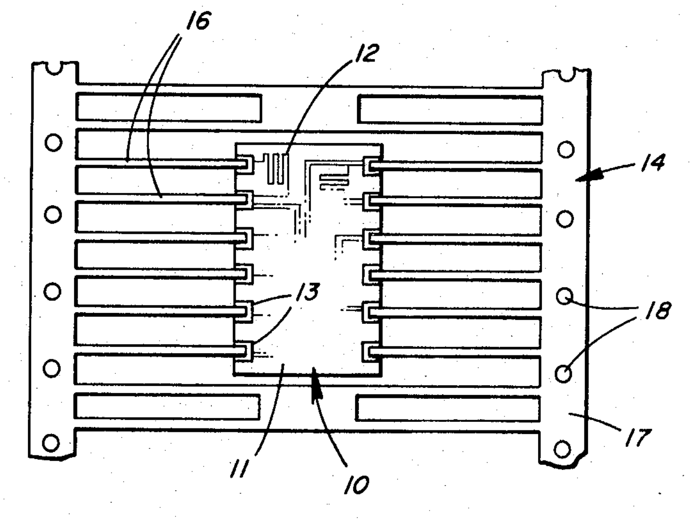
FIG. 1 PRIOR ART
FIG. 1 is a plan view of a thin-film integrated circuit after it has been bonded to the leads of a typical prior art lead frame.

FIG. 1 depicts a typical prior art integrated circuit 10 bonded to a prior art lead frame 14. The integrated circuit 10 comprises an insulated substrate 11 having thin-film resistors 12 and other components (not shown) deposited thereon. The resistors 12 are connected to a plurality of gold-plated terminal land areas 13 which are used to make connections between the integrated circuit and external circuitry. As previously discussed, lead wires may be bonded to land areas 13 one by one, but this is a very inefficient and time-consuming operation and it is highly desirable to bond all of the lead wires to the integrated circuit simultaneously. Lead frame 14 has been used in the prior art to accomplish the simultaneous bonding of all the lead wires to integrated circuit 10. Lead frame 14 is depicted as having been stamped out of a sheet of soft material, such as copper, to form a plurality of leads 16 supported from the edges 17 of lead frame 14. A plurality of holes 18 are formed in edges 17 so that the lead frame 14 may be registered with respect to land areas 13 of integrated circuit 10. As shown in FIG. 1, each of the leads 16 has a generally flat cross section.

As previously discussed, the use of a lead frame together with the compliant bonding technique disclosed in the above-referenced copending application permits the simultaneous bonding of a plurality of leads to an integrated circuit but requires at least two distinct operating steps. Also, as discussed, it is advantageous, in some applications, that the leads to be bonded to land areas 13 be of a circular cross section. It is not practical, however, to further process the leads of a lead frame to alter the cross section thereof.

Figure 2:
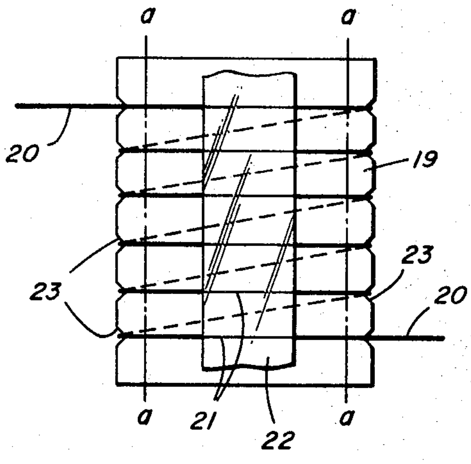
FIG. 2 is a plan view of a compliant support member, in accordance with this invention, showing a continuous filament spirally wound thereabout.

When a lead frame of the type shown in FIG. 1 is used in a compliant bonding operation, a suitably shaped compliant member, for example a piece of aluminum tape, is positioned thereover after the lead frame has been precisely aligned with respect to the integrated circuit, and suitable vibratory and/or mechanical bonding energy supplied through the compliant member to bond the leads to the land areas of the integrated circuit. The present invention contemplates methods and apparatus for producing a plurality of simultaneous bonds with the compliant member itself comprising an integral part of the lead frame. Referring now to FIG. 2, an illustrative embodiment of this invention comprises a support member 19 of compliant material, for example, aluminum or polytetrafluorethylene, which is advantageously wound in spiral fashion with a continuous metallic filament 20. Other winding configurations are, of course, possible, for example, serpentine. Indeed, as used in the specification and claims, the words "wound," "around," and "spiral" are not intended to be limiting but encompass any filament pattern or configuration which is laid onto or about the support member including one which is laid down only on one surface thereof. Generally speaking, the above language is intended to encompass any winding pattern or configuration which results in portions of the filament lying over or lying near the edges of the support member so that segments of the filament may act as electrical leads for the integrated circuit 10 or other workpiece when severed from the winding pattern.

Assuming an illustrative spiral winding operation has been performed, the individual spiral segments 21 are secured to at least one surface of support member 19 by any suitable adhesive means, for example, by means of a strip of adhesive tape 22, or by means of an easily-dissolvable, electrically nonconducting, adhesive, such as varnish, applied to the central portion of support member 19. The adhesive means serves to retain the continuous metallic filament 20 in a fixed relation to support member 19. As will be more fully discussed herebelow, the use of an electrically nonconducting, adhesive has the additional advantage of insulating the spiral segments 21, which are formed from filament 20, one from another.

A plurality of indentations, or slots 23, are formed along one, and preferably both, edges of support member 19. These indentations serve the dual purpose of: (1) restraining spiral segments 21 from movement on the surface of support member 19, prior to the application of adhesive means 22; and (2) controlling the spacing between the turns of the spiral. The spacing between adjacent slots is, of course, adjusted to correspond to the the spacing between adjacent spaced-apart locations on the second workpiece. If for any reason the spacing between adjacent spaced-apart locations is nonuniform, then a corresponding nonuniform spacing of the slots in the compliant support member will ensure precise alignment of the plurality of first workpieces and the spaced-apart locations on the second workpiece when the bonds are made, as more fully explained below. As an alternative to the slots 23, a plurality of apertures (not shown) may be punched or drilled along one or more edges of support member 19, and in that event, the filament 20 is threaded through the apertures, rather than being wound about the support member 19, as shown in FIG. 2.

In the illustrative embodiment of FIG. 2, the support member 19 is shown as having a generally rectangular configuration. However, it will be appreciated that support member 19 may have any desired configuration, the shape being dictated primarily by the configuration of integrated circuit 10, or other workpiece, to which the bonds are to be made. More specifically, support member 19 could be formed, for example, in the shape of the letter "E" if the land areas on integrated circuit 10 were arranged in such a pattern and were not as shown in FIG. 1. It will also be appreciated that slots 23 may be omitted, if desired, provided that sufficient friction and/or tension exists to ensure that the windings of the spiral do not shift unacceptably.

Advantageously, support member 19 has a generally flat cross section. Again, however, this is not mandatory and the cross section of support member 19 may be selected as dictated by the configuration of integrated circuit 10, or other workpiece, to which the bonds are to be made.

Figure 3A:
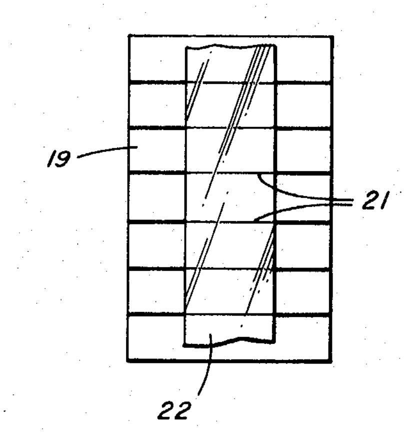
FIG. 3*a* and FIG. 3*b* are plan views of the front and rear faces, respectively, of the support member shown in FIG. 2 after both edges thereof have been sheared.

After filament 20 has been spirally wound about support member 19 and secured thereto by adhesive means 22, at least one edge, and preferably both edges, of support member 19 are cut along section lines *a-a* to produce the configuration shown in FIG. 3*a*. Any suitable means may be utilized to cut the edges of support member 19, for example a conventional metal shearing press. The unaffixed segments 21 of the former spiral laying on the rear face, and those few segments 21 on the front face which were not secured by adhesive means 22 to support member 19, are removed during, or immediately after, the cutting step and no longer play any part in the described, illustrative, bonding process.

Figure 3B:
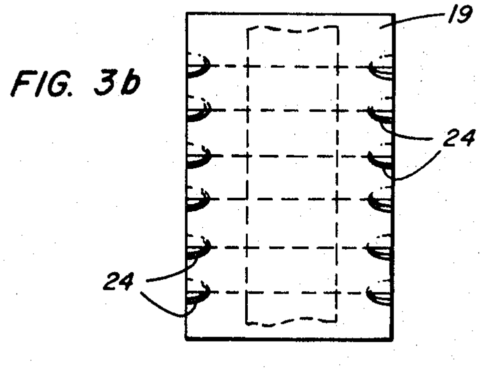

Because support member 19 is formed used and upon the winding a compliant, deformable material, when the edges thereof are sheared, the material which comprises support member 19 deforms slightly about those segments 21 which remain secured by adhesive means 22 to the front face of support member 19. As shown in FIG. 3*b*, this produces a series of small marks 24 on the rear surface of support member 19. These marks may be concave or convex depending upon the particular shearing or cutting process used and upon the winding configuration. The visible marks which are formed on the rear face of the support member, correspond precisely to the locations of segments 21 on the front face and may advantageously be used to accurately position support member 19 with respect to integrated circuit 10, or other workpiece, so that segments 21, which now act as the lead wires to be bonded, are precisely aligned with respect to the terminal land areas 13 of integrated circuit 10.

Figure 4:
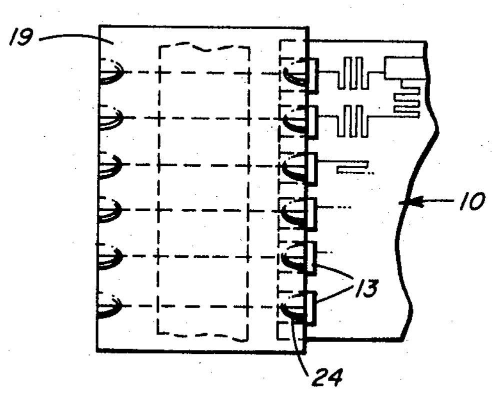
FIG. 4 is a plan view of the support member shown in FIG. 3*a* and FIG. 3*b* after registration with, and bonding to, an integrated circuit of the type shown in FIG. 1*a*.

FIG. 4 shows support member 19 after it has been aligned with respect to terminal land areas 13 and illustrates the use of visible marks 24 to accomplish this alignment. After the alignment has been completed, vibratory and/or mechanical bonding energy is applied by means (not shown), through support member 19, to bond each of the segments 21 to the corresponding terminal land area 13. The mechanism by which these bonds are produced is more fully disclosed in the above-referenced copending application. As disclosed therein, the vibratory bonding energy may comprise, for example, ultrasonic (including audible) vibratory energy and the mechanical bonding energy may comprise, for example, heat and ram pressure applied through the support member. Also as disclosed in the above-referenced copending application, the material from which support member 19 is manufactured may advantageously comprise a metal, such as aluminum having an adherent oxide coating thereon, the metal being such as to deform plastically around the plurality of first workpieces when the vibratory and/or mechanical bonding energy is applied thereto.

Figure 5A:
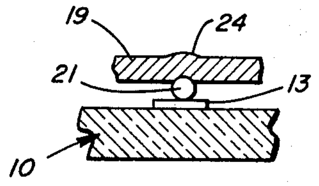
FIGS. 5*a*, 5*b* and 5*c* are partial side elevation views of one of the lead wires and a portion of the integrated circuit depicting the various states of the lead wire during the bonding process.
Figure 5D:
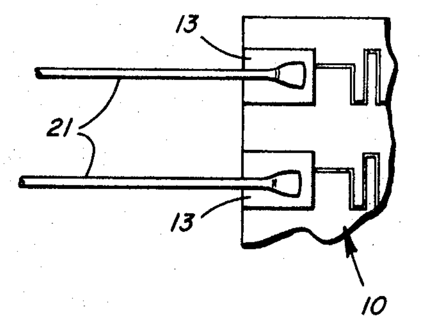
FIG. 5*d* is a partial plan view showing the completed pattern of spaced bonds.
Figure 5B:
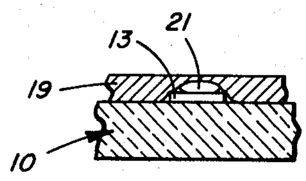

FIG. 5*a* is a side elevation view showing a portion of support member 19 positioned so that visible marks 24 and segment 21 are adjacent to a land area 13 of integrated circuit 10. The vertical scale of the figure has been distorted so that the slight deformation of support member 19 around segment 21 and the corresponding visible mark 24 which is formed is clearly seen. Practically, however, even if no appreciable deformation is formed, the rear face of support member 19 will nevertheless be sufficiently marked by the shearing or cutting step to permit satisfactory alignment. FIG. 5*b* shows the same cross section after the application of vibratory and/or mechanical bonding energy through support member 19 and shows the flattening of the terminal end of segment 21 and the bonding thereof to land area 13. This flattening is not sufficient to materially affect the current-carrying capability of the lead 21 connecting integrated circuit 10 to the external circuitry with which it is to work. The circular configuration of segment 21, when subjected to bonding energy applied through compliant support member 19, initially produces a relatively high pressure between segment 21 and the terminal land area 13, which pressure is greater than that which would be obtained if segment 21 were to have the generally flat cross section found in the prior art. This is believed to be the reason why the bond which is obtained by the use of the instant invention is superior to that obtained with the use of a flat lead wire.

Figure 5C:
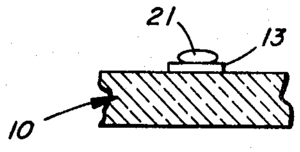

After the bonding energy has been applied to support member 19 to simultaneously bond all segments 21 to the corresponding land areas 13, the adhesive tape is removed, or the easily dissolvable adhesive dissolved, and support member 19 withdrawn, leaving only segments 21 which, of course, now act as the leads, bonded to integrated circuit 10. As previously discussed, if the adhesive used is an electrically nonconducting adhesive, for example varnish, the lead wires will be partially insulated one from the other, a distinct advantage, as this insulation will tend to prevent electrical short circuits if the lead wires should accidentally touch one another when the integrated circuit is ultimately assembled in a working electronic circuit or during a testing operation. FIG. 5*c* and FIG. 5*d* are partial side and top elevation views of completed bonds showing the configuration thereof.

The methods and apparatus of this invention may also be used to interconnect two or more integrated circuits 10, or other workpieces, together. FIG. 4 shows compliant support member 19 with its right edge aligned with respect to an integrated circuit 10. However, if a second integrated circuit 10 were to be positioned with respect to the left edge of support member 19, then the application of bonding energy to support member 19 would bond both ends of each filament segment 21 to a terminal land area 13 on two integrated circuits 10, thereby interconnecting the terminal land areas thereof on a one-to-one basis. Further, by the choice of a suitably patterned support member 19, and by an appropriate arrangement of the slots 23 and/or an appropriate choice of a filament winding pattern, the methods of this invention could be used to simultaneously interconnect a plurality of workpieces, should this be desired.

The invention has been described in the context of simultaneously bonding a plurality of lead wires to an integrated circuit. However, it will be obvious to one skilled in the art that the methods and apparatus disclosed herein are not so limited and may be used generally wherever it is desired to simultaneously bond a plurality of first workpieces to one or more second workpieces. It will be understood, therefore, that various changes in the details, steps, material, or arrangement of parts which have been described and illustrated in order to explain the nature of the invention may be made by those skilled in the art within the principles and scope of the invention and defined in the appended claims.

What is claimed is:

1. A method of forming a plurality of leads, and bonding said plurality of leads to spaced-apart locations on at least one supported workpiece, comprising the steps of:

forming said plurality of leads by spirally winding a filament about a compliant support member;

securing said filament to at least one surface of said support member; and cutting at least one edge of said support member to sever the windings of said filament to form said plurality of leads;

aligning said at least one surface of said support member with respect to said at least one workpiece so that said plurality of leads are adjacent the spaced-apart locations on said at least one workpiece; and applying sufficient thermal and/or mechanical bonding energy to said support member to deform the member around said plurality of leads to bond said plurality of leads to the spaced-apart locations on said at least one workpiece.

2. The method according to claim 1 wherein said support member comprises a flat, rectangular plate, and wherein said forming step comprises the additional step of:

notching at least one edge of said plate, prior to said winding step, to retain the windings of said filament until said windings are secured by said securing step.

3. A method according to claim 2 comprising the further step of:

providing sufficient pressure, during said cutting step, to partially deform said support member about the windings of said filament to produce visible markings on the reverse face of said plate.

4. A method according to claim 3 wherein said aligning step further comprises:

aligning said at least one surface of said rectangular plate, with respect to said at least one workpiece, by positioning the reverse side of said plate so that said visible markings and hence said plurality of leads are adjacent said spaced-apart locations.

5. A method of bonding according to claim 4 comprising the further step of:

unsecuring the secured portions of the now-severed filament windings from said plate so that said plurality of leads are supported by the bonds to said at least one workpiece.

6. A method according to claim 4 wherein said support member comprises a flat, rectangular plate, and the method comprises the further steps of:

notching at least one edge of said plate, prior to said winding step, to retain the windings of said spirally wound filament until said windings are secured by said securing step; and varying the distance between adjacent ones of said notches to correspond to the spacing between adjacent ones of said space-apart locations.

7. A method according to claim 6 comprising the further step of:

providing sufficient pressure, during said cutting step, to partially deform said support member about the windings of said spirally wound filament to produce visible markings on the reverse face of said plate.

8. A method according to claim 7 wherein said aligning step further comprises:

aligning said at least one surface of the rectangular plate, with respect to said at least one workpiece, by positioning the reverse face of said plate so that said visible markings, and hence said plurality of leads, are adjacent said spaced-apart locations.

9. A method of bonding according to claim 8 comprising the further step of:

unsecuring the secured portions of the now-severed spirally wound filament windings from said plate so that said plurality of leads are supported by the bonds to said at least one workpiece.

10. A method of bonding according to claim 1 comprising the further step of:

unsecuring the secured portions of the now-severed filament windings from said support member so that said plurality of leads are supported by the bonds to said at least one workpiece.

11. A method of bonding according to claim 1 wherein said bonding energy is ultrasonic vibratory energy.

12. A method of bonding according to claim 1 wherein said bonding energy comprises heat and ram pressure applied through said plate.

13. A bonding method according to claim 1 wherein said support member comprises a metal having an adherent oxide coating thereon, said metal deforming plastically around said plurality of first workpieces.

14. A bonding method according to claim 1 wherein said securing step comprises coating said at least one surface and said filament with a nonconducting adhesive, said adhesive serving to insulate said plurality of leads one from another after said plurality of leads have been separated from the plate.

15. A method according to claim 1 wherein said forming step further comprises:

selectively varying the spacing between adjacent turns of said spirally wound filament to correspond to the spacing between adjacent ones of said spaced apart locations.

16. A method of bonding a plurality of leads formed by: spirally winding a filament about a compliant support member; securing said filament to at least one surface of said support member, and, cutting at least one edge of said support member to sever the windings of said filament, comprising the steps of:

aligning said at least one surface of said support member with respect to said at least one workpiece so that said plurality of leads are adjacent the spaced-apart locations on said at least one workpiece; and applying sufficient thermal and/or mechanical bonding energy to said support member to deform the member around said plurality of leads to bond said plurality of leads to the spaced-apart locations on said at least one workpiece.

* * * * *